United States Patent
Hirano et al.

(10) Patent No.: US 9,972,522 B2
(45) Date of Patent: May 15, 2018

(54) PROCESSING APPARATUS AND DEVICE MANUFACTURING METHOD

(71) Applicant: CANON KABUSHIKI KAISHA, Tokyo (JP)

(72) Inventors: Shinichi Hirano, Utsunomiya (JP); Kohei Yamada, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 200 days.

(21) Appl. No.: 14/149,341

(22) Filed: Jan. 7, 2014

(65) Prior Publication Data

US 2014/0199635 A1 Jul. 17, 2014

(30) Foreign Application Priority Data

Jan. 15, 2013 (JP) ................................. 2013-004956

(51) Int. Cl.
| | | |
|---|---|---|
| *H01L 21/673* | (2006.01) | |
| *H01L 21/687* | (2006.01) | |
| *H01L 21/67* | (2006.01) | |
| *G03F 7/20* | (2006.01) | |

(52) U.S. Cl.
CPC ........ *H01L 21/68707* (2013.01); *G03F 7/707* (2013.01); *G03F 7/70783* (2013.01); *G03F 7/70925* (2013.01); *H01L 21/67288* (2013.01); *Y10T 279/34* (2015.01)

(58) Field of Classification Search
CPC ....................... G03F 7/70783; H01L 21/68714
USPC .......................................... 430/319; 134/137
See application file for complete search history.

(56) References Cited

U.S. PATENT DOCUMENTS

| 7,078,262 B2 | 7/2006 | Yamamoto et al. |
| 7,215,407 B2 | 5/2007 | Yamamoto |
| 8,441,614 B2 | 5/2013 | Hirano et al. |
| 9,123,760 B2 * | 9/2015 | Hirano ................... G03B 27/58 |

FOREIGN PATENT DOCUMENTS

| JP | 2001-284434 A | 10/2001 |
| JP | 2003-234392 A | 8/2003 |
| JP | 2010034427 A | 2/2010 |
| KR | 20050009133 A | 1/2005 |
| TW | 200300999 A | 6/2003 |

OTHER PUBLICATIONS

Taiwanese Office Action issued in Taiwanese counterpart application No. TW102145878, dated Oct. 13, 2015. English translation provided.
Official Action issued in corresponding Korean Appln. No. 10-2014-0001710 dated Mar. 2, 2016.

* cited by examiner

*Primary Examiner* — Daborah Chacko-Davis
(74) *Attorney, Agent, or Firm* — Rossi, Kimms & McDowell LLP

(57) ABSTRACT

A processing apparatus for processing a substrate chucked by a chuck installed on a stage includes: a conveying unit configured to convey the substrate to the chuck; a robot configured to selectively convey, to the stage, a pressing member capable of pressing the substrate to reduce a warp of the substrate chucked by the chuck and a cleaning member capable of cleaning a chuck surface; and a controller configured to cause the robot holding the pressing member to execute pressing processing for correcting the warp of the substrate and cause the robot holding the cleaning member to execute cleaning processing of the chuck surface.

26 Claims, 15 Drawing Sheets

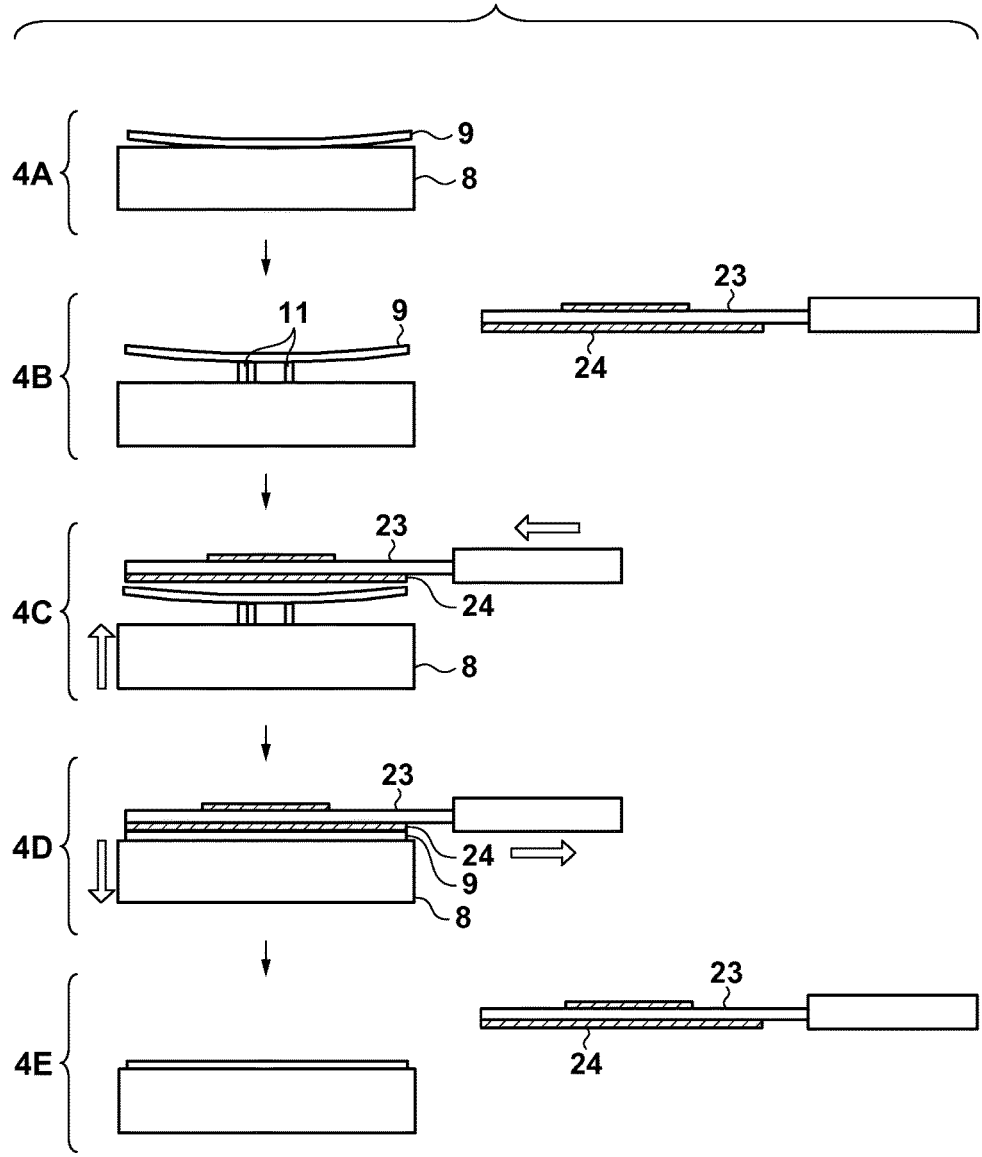

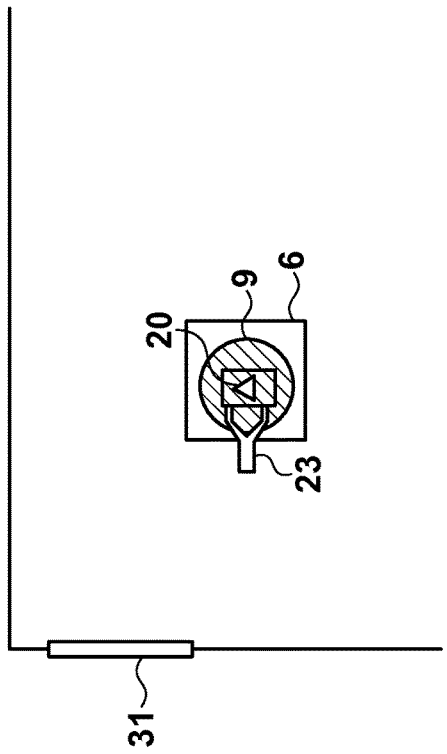
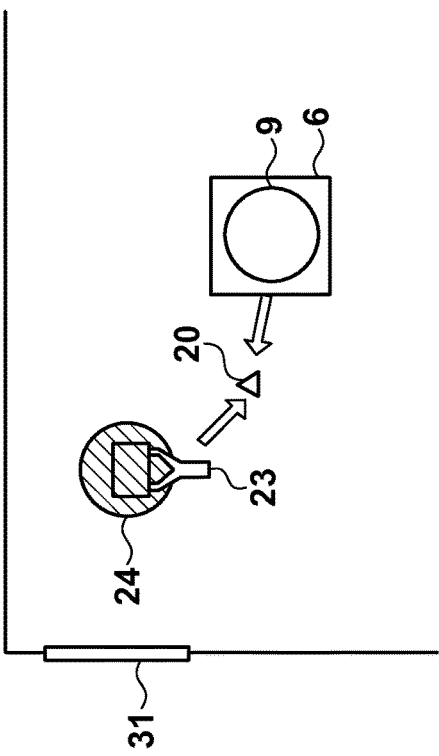

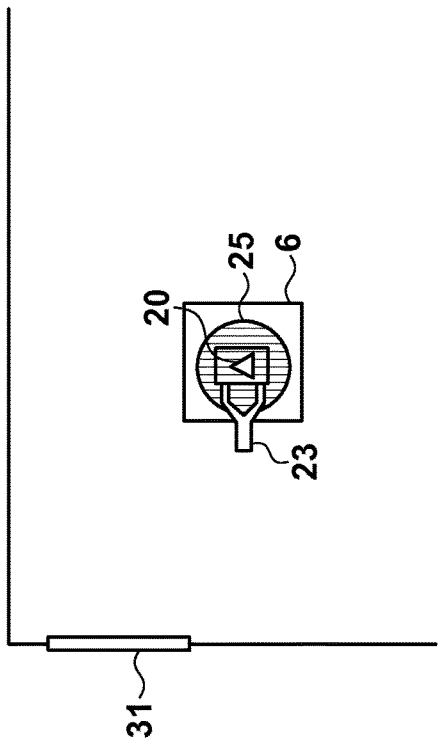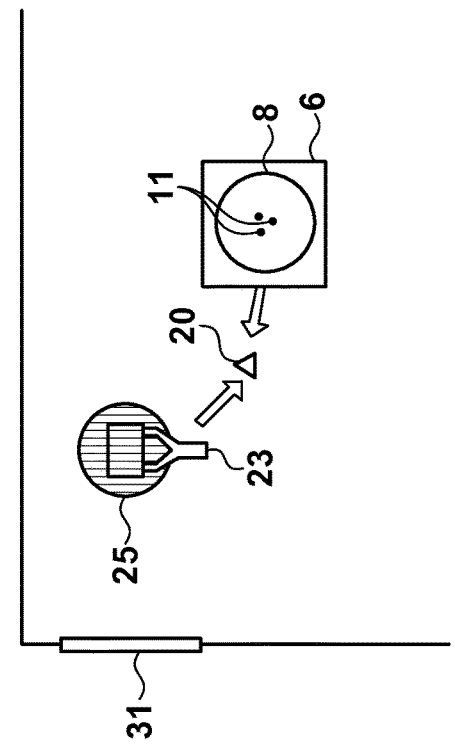

PROCESSING APPARATUS AND DEVICE MANUFACTURING METHOD

BACKGROUND OF THE INVENTION

Field of the Invention

The present invention relates to a processing apparatus and a device manufacturing method.

Description of the Related Art

An exposure apparatus used to manufacture a semiconductor device includes a wafer conveying hand that supplies/collects a wafer to/from a wafer stage, a pre-alignment stage, a wafer stage, and a conveying robot that conveys a foreign substance removing member for a wafer chuck. The pre-alignment stage aligns a wafer using a notch or an orientation flat before moving the wafer to the wafer stage. The wafer stage holds and conveys the wafer by vacuum chuck. The surface shape of the wafer vacuum-chucked by the wafer chuck and held on the wafer stage is measured using a focus sensor. The wafer surface is located at the focus position based on the shape, and exposure is performed.

Presently, a stepper that performs cell projection by reducing a conventional almost square exposure region and projecting it onto a wafer and a scanner that accurately exposes a large screen by relatively scanning a reticle and a wafer at a high speed, using an exposure region formed into a rectangular slit shape are used as the exposure apparatuses. Alignment between the reticle and each shot on the wafer is done by optically detecting the positions of alignment marks corresponding to the respective shots, which are exposed and transferred to the wafer at the same time as the circuit pattern on the reticle, and positioning the wafer with respect to the reticle based on the detection result. Normally, AGA (Advanced Global Alignment) is performed. AGA is an alignment method of moving the wafer stage to the exposure position based on statistical estimation calculation by the position information of a plurality of alignment marks. Selection of the alignment marks to be used for AGA measurement is constant independently of the shape of the wafer.

Along with an increase in the integration degree of semiconductor devices, micronization and multilayering of interconnections are proceeding. The multilayered structure of interconnection layers causes a phenomenon in which film distortions that have occurred during deposition accumulate and warp the whole wafer later in the semiconductor manufacturing process. In the TSV (Through Silicon Via) process that is a stacking technique for a semiconductor chip, the difference in the thermal expansion coefficient between the metal (for example, copper) of a through electrode and the ambient silicon causes a distortion between the silicon and the through electrode metal. A wafer may warp due to this distortion. Failing in coping with the warping amount of the wafer, an error may occur in vacuum chuck of the wafer chuck, and the sequence may stop. When the wafer warps, a local distortion occurs in the wafer on the wafer chuck, affecting AGA measurement or scan exposure.

Japanese Patent Laid-Open No. 2001-284434 discloses a wafer conveying robot including a periphery pressing member configured to correct the warp of a wafer. Japanese Patent Laid-Open No. 2003-234392 also discloses a wafer conveying mechanism including a pressing plate configured to correct the warp of a wafer.

In the apparatuses described in Japanese Patent Laid-Open Nos. 2001-284434 and 2003-234392, however, since the periphery pressing member or pressing plate configured to correct the warp of the wafer is provided on the wafer conveying robot, the weight of the object conveyed by the robot increases. Hence, when no chuck error exists, it is difficult to convey the wafer at a high speed and accuracy. In addition, when correcting the warp of the wafer by the periphery pressing member or pressing plate to cope with a chuck error, subsequent wafers cannot be prepared. Hence, the lot processing takes a long time.

SUMMARY OF THE INVENTION

The present invention provides a technique of simultaneously achieving high throughput and recovery of a substrate chuck failure of a chuck.

The present invention in its one aspect provides a processing apparatus for processing a substrate chucked by a chuck installed on a stage, the apparatus comprising: a conveying unit configured to convey the substrate to the chuck; a robot configured to selectively convey, to the stage, a pressing member capable of pressing the substrate to reduce a warp of the substrate chucked by the chuck and a cleaning member capable of cleaning a chuck surface; and a controller configured to cause the robot holding the pressing member to execute pressing processing for correcting the warp of the substrate and cause the robot holding the cleaning member to execute cleaning processing of the chuck surface.

Further features of the present invention will become apparent from the following description of exemplary embodiments with reference to the attached drawings.

BRIEF DESCRIPTION OF THE DRAWINGS

FIG. 4 is a schematic: view for explaining conveyance of the pressing plate and chuck failure recovery processing by the pressing plate;

FIGS. 5A and 5B are schematic views for explaining conveyance of the pressing plate according to the first embodiment;

FIGS. 6A and 6B are schematic: views for explaining conveyance of a foreign substance removing member according to the first embodiment;

DESCRIPTION OF THE EMBODIMENTS

The present invention will now be described with reference to the accompanying drawings. The present invention is applicable to a processing apparatus for processing a substrate chucked by a chuck included in a stage. An exposure apparatus that performs exposure processing for a substrate will be described. The chuck is not limited to a vacuum chuck that vacuum-chucks a substrate, and may be an electrostatic chuck that electrostatically chucks a substrate.

[Exposure Apparatus]

Figure 1:
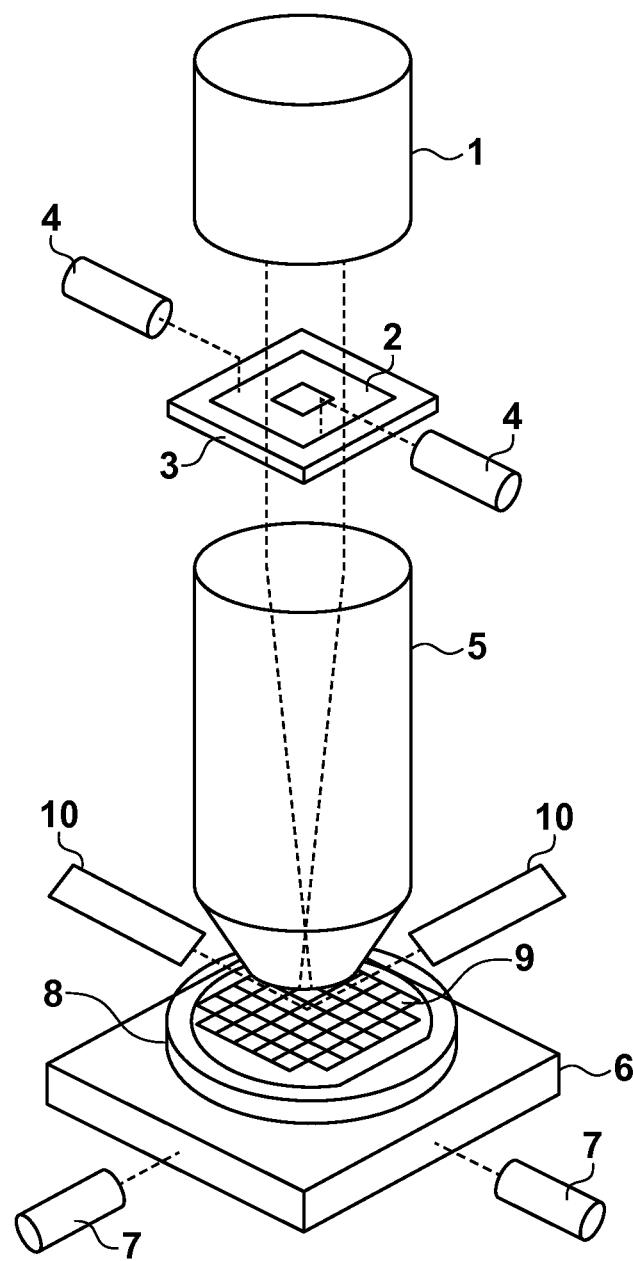
FIG. 1 is a view showing the arrangement of an exposure apparatus.

FIG. 1 shows the schematic arrangement of an exposure apparatus. As shown in FIG. 1, the exposure apparatus includes an illumination system 1, a reticle stage 3 that holds a reticle 2, reticle position measurement devices 4, a projection optical (projection exposure lens) system 5, and a wafer stage (stage) 6 that holds a wafer (substrate) 9. The exposure apparatus further includes laser interferometers 7, a wafer chuck (chuck) 8 that vacuum-chucks the wafer, a wafer Z-driving mechanism (not shown) arranged under the wafer chuck 8, and auto focus units 10 that measure the focus position of the wafer 9. The illumination system 1 includes a light source and a shutter. A circuit pattern is drawn on the reticle 2. The reticle position measurement devices 4 measure the position of the reticle 2 on the reticle stage 3. The wafer stage 6 with the wafer 9 as the exposure target placed thereon moves in two, X and Y directions within the X-Y plane. The laser interferometers 7 measure the position of the wafer stage 6. The wafer Z-driving mechanism is provided under the wafer chuck 8, and moves the wafer 9 placed on it in the vertical direction (Z direction) for focus adjustment (focusing) at the time of exposure.

First Embodiment

Figure 2:
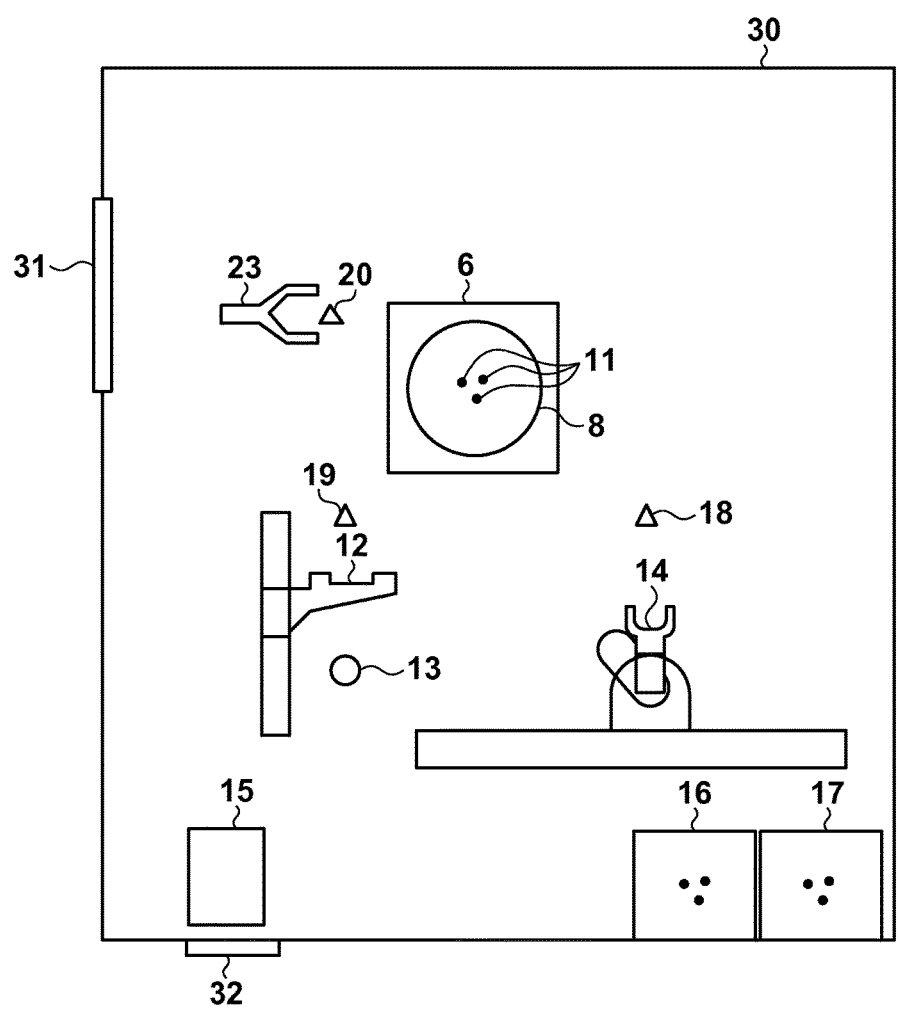
FIG. 2 is a schematic view showing the apparatus viewed from the upper side so as to explain portions concerning conveyance of a wafer and conveyance of members configured to recover a chuck failure according to the first embodiment.

FIG. 2 is a schematic view showing an apparatus viewed from the upper side, placing focus on portions concerning conveyance of a wafer 9 and conveyance of members configured to recover a chuck failure of the wafer 9 by a wafer chuck 8. The exposure apparatus includes a chamber 30 with a door 31, the wafer chuck 8, three pins 11, a wafer stage 6, a wafer load station 16, a wafer unload station 17, a controller 15, and a pre-alignment unit 13. The exposure apparatus also includes a wafer conveying robot hand 14, a wafer feeding hand 12, and a robot hand 23. The chamber 30 maintains the exposure environment at predetermined temperature and humidity. The wafer chuck 8 vacuum-chucks the wafer 9 under the projection exposure lens 5. The three pins 11 are vertically driven to transfer the wafer 9 to the wafer chuck 8. The wafer stage 6 integrally moves the wafer 9, the wafer chuck 8, and the three pins 11 in two, X and Y directions within the X-Y plane. The wafer 9 that has not undergone exposure processing is loaded from the outside of the chamber 30 and arranged in the wafer load station 16. The wafer 9 that has undergone exposure processing is arranged in the wafer unload station 17 and unloaded to the outside of the chamber 30. The controller 15 is a computer that controls the exposure apparatus and is electrically connected to a user interface 32. The pre-alignment unit 13 performs pre-alignment (pre-processing) of the wafer 9 before exposure processing.

The wafer conveying robot hand 14 conveys the wafer 9 loaded into the wafer load station 16 to the pre-alignment unit 13, and also conveys the wafer 9 having undergone exposure processing and arranged on the three pins 11 to the wafer unload station 17. The wafer feeding hand 12 conveys the wafer 9 pre-aligned by the pre-alignment unit 13 to the three pins 11. The robot hand 23 conveys members configured to recover a chuck failure of the wafer chuck 8 to the wafer stage 6. The wafer feeding hand 12 constitutes a conveying unit that conveys the substrate to the chuck. The robot hand 23 constitutes a robot that conveys the members configured to recover a chuck failure to the stage.

Transfer of the wafer 9 between the wafer chuck 8 and the three pins 11 can be done by either a structure that vertically moves the three pins 11 or a structure that stops the three pins 11 and vertically moves the wafer chuck 8. The controller 15 can be formed from either one computer or a plurality of computers.

The transfer position of the wafer 9 and the position to execute recovery processing of the chuck failure of the wafer chuck 8 will be described next. At a wafer transfer position 19, the wafer feeding hand 12 transfers the wafer 9 to the three pins 11 arranged on the wafer stage 6. At a wafer collection position 18, the wafer conveying robot hand 14 receives the wafer 9 from the three pins 11 arranged on the wafer stage 6. The robot hand 23 conveys a pressing plate (pressing member) 24 to a recovery processing position 20 and reduces (corrects) the warp of the wafer 9 by the pressing plate 24, thereby executing chuck failure recovery processing. The wafer collection position 18, the wafer transfer position 19, and the recovery processing position 20 only indicate the positions of the wafer stage 6 where the respective processes are executed.

Figure 3:
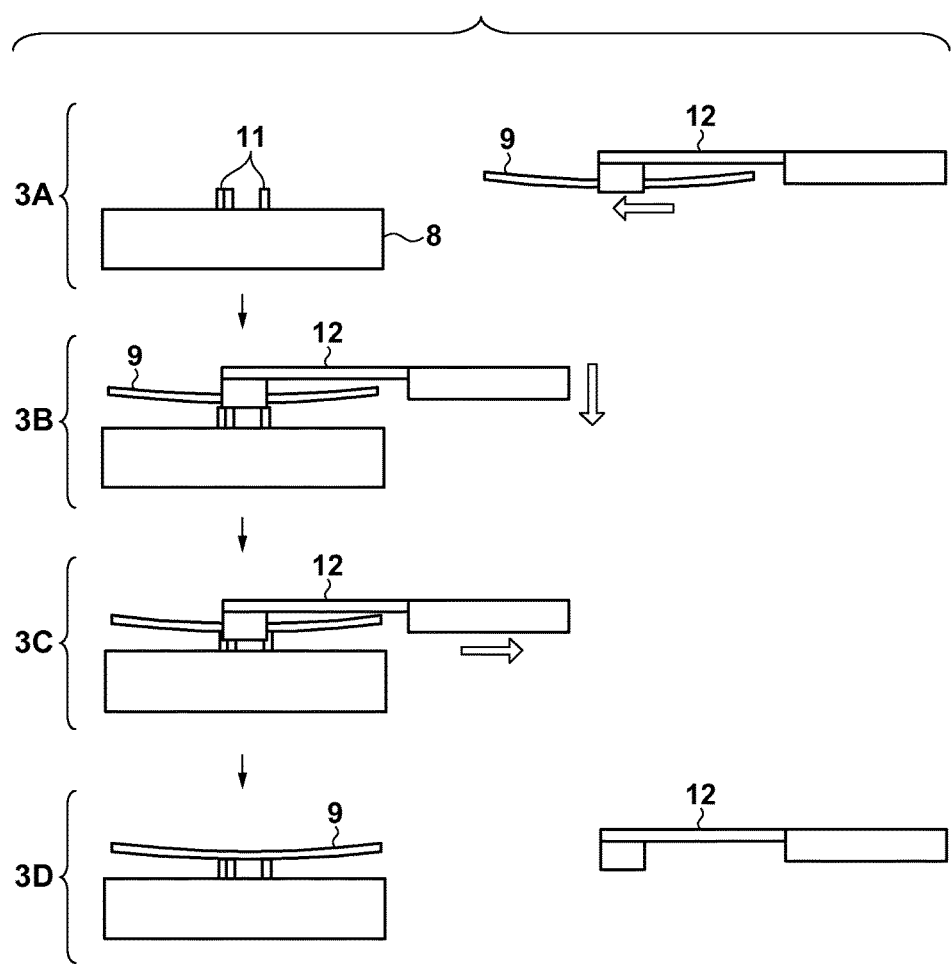
FIG. 3 is a schematic: view for explaining a state in which the wafer is transferred to three pins.

FIG. 3 is a schematic view time-serially showing motion viewed from the lateral direction in processing of causing the wafer feeding hand 12 to transfer the wafer 9 to the three pins 11 integrated with the wafer chuck 8. In a state 3A, the wafer feeding hand 12 holding the wafer 9 moves to the wafer transfer position 19 above the three pins 11. In a state 3B, the wafer feeding hand 12 holding the wafer 9 moves downward at the wafer transfer position 19 and transfers the wafer 9 to the three pins 11. In a state 3C, the wafer feeding hand 12 that has transferred the wafer 9 to the three pins 11 retracts. In a state 3D, retraction of the wafer feeding hand 12 is completed, and transfer of the wafer 9 to the wafer chuck 8 is completed.

FIG. 4 is a schematic view time-serially showing motion viewed from the lateral direction in a state in which the robot hand 23 conveys, to the recovery processing position 20, the pressing plate 24 that is one of the members configured to recover a chuck failure, and executes recovery processing. In a state 4A of FIG. 4, after the transfer of the wafer 9 to the wafer chuck 8 is completed in the state 3D of FIG. 3, the height difference between the wafer chuck 8 and the three pins 11 is relatively decreased, and the wafer chuck 8 receives the wafer 9. Transfer of the wafer 9 can be done in either a mode in which the wafer chuck 8 rises while keeping the three pins 11 fixed or a mode in which the three pins 11 lower while keeping the wafer chuck 8 fixed. When the transfer has ended, the wafer chuck 8 chucks the wafer 9. The controller 15 determines whether a chuck failure has occurred by determining, for example, whether the chucking force of the wafer chuck 8 falls within an allowable range. In a state 4B, upon determining that a chuck failure has occurred, the controller 15 moves the wafer stage 6 to the recovery processing position 20 to execute chuck failure recovery processing, and the robot hand 23 prepares the pressing plate 24. When the wafer stage 6 moves to the recovery processing position 20, the wafer 9 is transferred from the wafer chuck 8 to the three pins 11. After the three pins 11 chuck and hold the wafer 9, the wafer stage 6 moves. In general, the apparatus is designed to allow the three pins 11 to chuck and hold the wafer even when it is determined that a failure of the chuck by the wafer chuck 8 has occurred.

In a state 4C, the robot hand 23 moves the pressing plate 24 to the recovery processing position 20. After completion of the movement, the wafer chuck 8 rises. In a state 4D, the wafer 9 is sandwiched between the pressing plate 24 and the wafer chuck 8, and the warp of the wafer 9 is corrected. When the warp of the wafer 9 is corrected, it is judged that the wafer chuck 8 can perform normal chuck, and the wafer chuck 8 lowers. In a state 4E, the wafer chuck 8 normally chucks and holds the wafer 9, and the robot hand 23 retracts the pressing plate 24 to the waiting position.

FIGS. 5A and 5B are schematic views time-serially showing motion viewed from the upper side in a state in which the robot hand 23 conveys the pressing plate 24 to the recovery processing position 20, and executes chuck failure recovery processing by correcting the warp of the wafer 9. FIG. 5A shows a state in which the operator sets the pressing plate 24 on the robot hand 23 via the door 31 and waits. The controller 15 determines whether a failure of chuck of the wafer 9 by the wafer chuck 8 of the wafer stage 6 located at the wafer transfer position 19 has occurred. In the state of FIG. 5B, based on determining that a chuck failure has occurred, the controller 15 moves the wafer stage 6 and the robot hand 23 holding the pressing plate 24 to the recovery processing position 20. At the recovery processing position 20, the chuck failure recovery processing explained with reference to FIG. 4 is executed. When the recovery processing has ended, the operator may collect the pressing plate 24 from the robot hand 23 via the door 31, or the robot hand 23 may wait at the position in FIG. 5A while keeping holding the pressing plate 24. When continuously or frequently executing the chuck failure recovery processing, the robot hand 23 can wait at the waiting position while keeping holding the pressing plate 24, as a matter of course.

FIGS. 6A and 6B are schematic views time-serially showing motion viewed from the upper side in a state in which the robot hand 23 conveys, to the recovery processing position 20, a foreign substance removing member 25 configured to remove foreign substances existing on the chuck surface of the wafer chuck 8, and removes the foreign substances from the wafer chuck 8. The foreign substance removing member 25 is a cleaning member that cleans the chuck surface of the wafer chuck 8. The foreign substance removing member 25 is one of the members configured to recover a chuck failure of the wafer chuck 8. The foreign substance removing member 25 is formed from, for example, a plate that pulverizes foreign substances and removes them from the vacuum chuck holes of the wafer chuck 8 or a member that removes foreign substances using an adhesive mechanism. FIG. 6A shows a state in which the operator sets the foreign substance removing member 25 on the robot hand 23 via the door 31 and waits. In the state of FIG. 6B, the controller 15 moves the wafer stage 6 and the robot hand 23 holding the foreign substance removing member 25 to the recovery processing position 20. At the recovery processing position 20, the wafer stage 6 moves in the X and Y directions while being in contact with the foreign substance removing member 25 at a standstill, thereby removing the foreign substances sticking to the wafer chuck 8. After removal of the foreign substances from the wafer chuck 8, the operator may collect the foreign substance removing member 25 from the robot hand 23 via the door 31, or the robot hand 23 may wait at the waiting position as shown in FIG. 6A while keeping holding the foreign substance removing member 25. When continuously or frequently removing foreign substances, the robot hand 23 can quickly remove the foreign substances by waiting at the waiting position while keeping holding the foreign substance removing member 25, as a matter of course.

Figure 7:
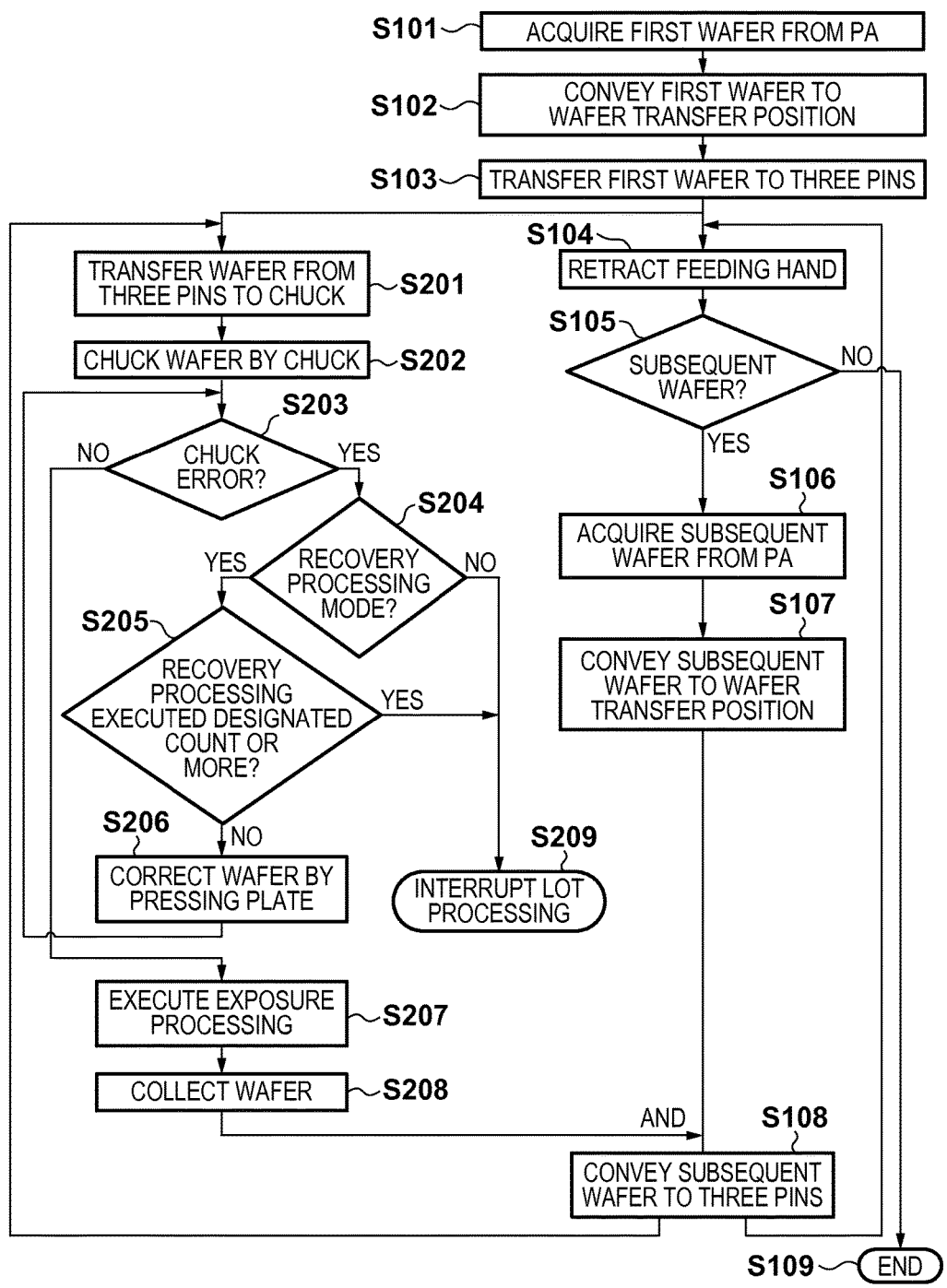
FIG. 7 is a flowchart showing the procedure of processing on a wafer stage, wafer collection processing, and wafer preparation processing according to the first embodiment.

FIG. 7 is a flowchart showing the procedure of processing on the wafer stage 6, collection processing of the wafer 9, and preparation processing of the wafer 9 when the warp of the wafer 9 is corrected using the pressing plate 24 as chuck failure recovery processing. The left-side portion of the flowchart indicates the procedure of processing on the wafer stage 6 and collection processing of the wafer 9, and the right-side portion of the flowchart indicates the procedure of preparation processing of the wafer 9. This embodiment is advantageous in terms of throughput because processing on the wafer stage 6 and collection processing of the wafer 9 are performed partially in parallel to preparation processing of the wafer 9. In step S101, the wafer feeding hand 12 acquires the first wafer 9 from the pre-alignment unit (PA) 13. The wafer conveying robot hand 14 conveys the wafer 9 loaded from the outside of the chamber 30 into the wafer load station 16 to the pre-alignment unit 13 in advance, and makes the wafer 9 wait in the pre-alignment unit 13.

In step S102, the wafer feeding hand 12 conveys the first wafer 9 from the pre-alignment unit 13 to the wafer transfer position 19. At this time, the wafer stage 6 is also moved by the controller 15 so as to be located at the wafer transfer position 19. In step S103, the wafer feeding hand 12 having the first wafer 9 lowers and transfers the wafer 9 to the three pins at the wafer transfer position 19, as indicated by the states 3B and 3C shown in FIG. 3. In step S104, the wafer feeding hand 12 retracts from the wafer transfer position 19, as indicated by the state 3D shown in FIG. 3.

In step S201, the controller 15 transfers the wafer 9 from the three pins 11 to the wafer chuck 8. The processes from step S201 and the processes from step S104 are executed in parallel. In step S105, the controller 15 judges whether the subsequent wafer 9 to be processed exists. If no subsequent wafer exists, the wafer preparation processing ends, and the procedure ends in step S109. If the subsequent wafer 9 exists, the process advances to step S106.

In step S106, the wafer feeding hand 12 acquires the subsequent wafer 9 from the pre-alignment unit (PA) 13. The wafer conveying robot hand 14 conveys the subsequent wafer 9 loaded from the outside of the chamber 30 into the wafer load station 16 to the pre-alignment unit 13 in advance, and makes the wafer 9 wait in the pre-alignment unit 13. In step S107, the wafer feeding hand 12 conveys the subsequent wafer 9 from the pre-alignment unit 13 to the wafer transfer position 19. The wafer feeding hand 12 that conveys the wafer 9 and the robot hand 23 that conveys the members configured to recover a chuck failure are separately constituted. Hence, the processes of steps S104 to S107 out of the wafer preparation processing can be executed in parallel to the chuck failure recovery processing. For this reason, even when the recovery processing needs to be performed, the decrease in the productivity can be minimized.

In step S202, the wafer chuck 3 chucks the wafer 9 transferred from the three pins 11. In step S203, the controller 15 judges whether vacuum chuck of the wafer 9 by the wafer chuck is normal, that is, the presence/absence of a vacuum chuck failure (chuck error). Upon determining that the chuck is normal, the process advances to step S207. Upon determining that a chuck failure has occurred, the process advances to step S204. In step S204, the controller 15 refers to information representing whether the mode to execute chuck failure recovery processing is set. If the mode is the recovery processing mode, the process advances to step S205. If the mode is not the recovery processing mode, the process advances to step S209. The information representing whether the mode to execute chuck failure recovery processing is set is input from the user interface 32 by the operator and stored in the controller 15. For example, if it is found in advance that the wafers 9 of a lot to undergo exposure processing do not warp, the operator inputs information representing that the recovery processing mode is not applied to the wafers 9 of the lot.

In step S205, the controller 15 determines whether the execution count of the chuck failure recovery processing by the pressing plate 24 has reached a predetermined count. If the recovery processing execution count is smaller than the predetermined count, the process advances to step S206. If the recovery processing execution count is equal to or larger than the predetermined count, the process advances to step S209. The predetermined count that defines the upper limit of the execution count of the chuck failure recovery processing by the pressing plate 24 can be changed by the operator based on the warping states of the wafers 9 of the exposure processing target before exposure processing. The operator can input the information of the predetermined count from the user interface 32 or an external computer (not shown) connected via a network. The predetermined count is set, for example, large when performing exposure processing of a lot of wafers having a large warping amount or small when performing exposure processing of a lot of wafers having a small warping amount. This makes it possible to suppress unnecessary execution of processing by the pressing plate 24 or relieve a chuck failure that can be recovered by processing of the pressing plate 24.

In step S206, the controller 15 executes chuck failure recovery processing by the pressing plate 24 using the method described with reference to FIG. 4. In step S207, the controller 15 executes exposure processing. In step S208, the wafer conveying robot hand 14 collects the exposed wafer 9 from the wafer stage 6, and conveys it to the wafer unload station 17. The wafer 9 conveyed to the wafer unload station 17 is unloaded by a developer (not shown) to the outside of the chamber 30. In step S209, the controller 15 judges that it is impossible to continue the processing, and interrupts the lot processing. When interrupting the lot processing, the controller 15 outputs information about the interrupt of the lot processing to at least the user interface 32 or an external computer (not shown) connected via a network.

As described above in the first embodiment, the hands 12 and 14 that convey the wafer 9 and the robot hand 23 that conveys the pressing plate 24 are separately constituted. This can make the wafer feeding hand 12 and the wafer conveying robot hand 14 lightweight. Hence, when chuck failure recovery processing is not performed, the wafer 9 can be conveyed to the wafer stage 6 at a high speed and accuracy. Additionally, even when the chuck failure recovery processing by the pressing plate 24 is being executed, preparation of the subsequent wafer 9 can be done using the wafer conveying robot hand 14. It is therefore possible to minimize the delay in the lot processing time. Furthermore, the robot hand 23 has the functions of removing/attaching and conveying the pressing plate 24 and the foreign substance removing member 25. Since any increase in the footprint of the exposure apparatus is prevented, and preparing a new conveyance robot is not necessary, an increase in the cost can be avoided.

Second Embodiment

Figure 8:
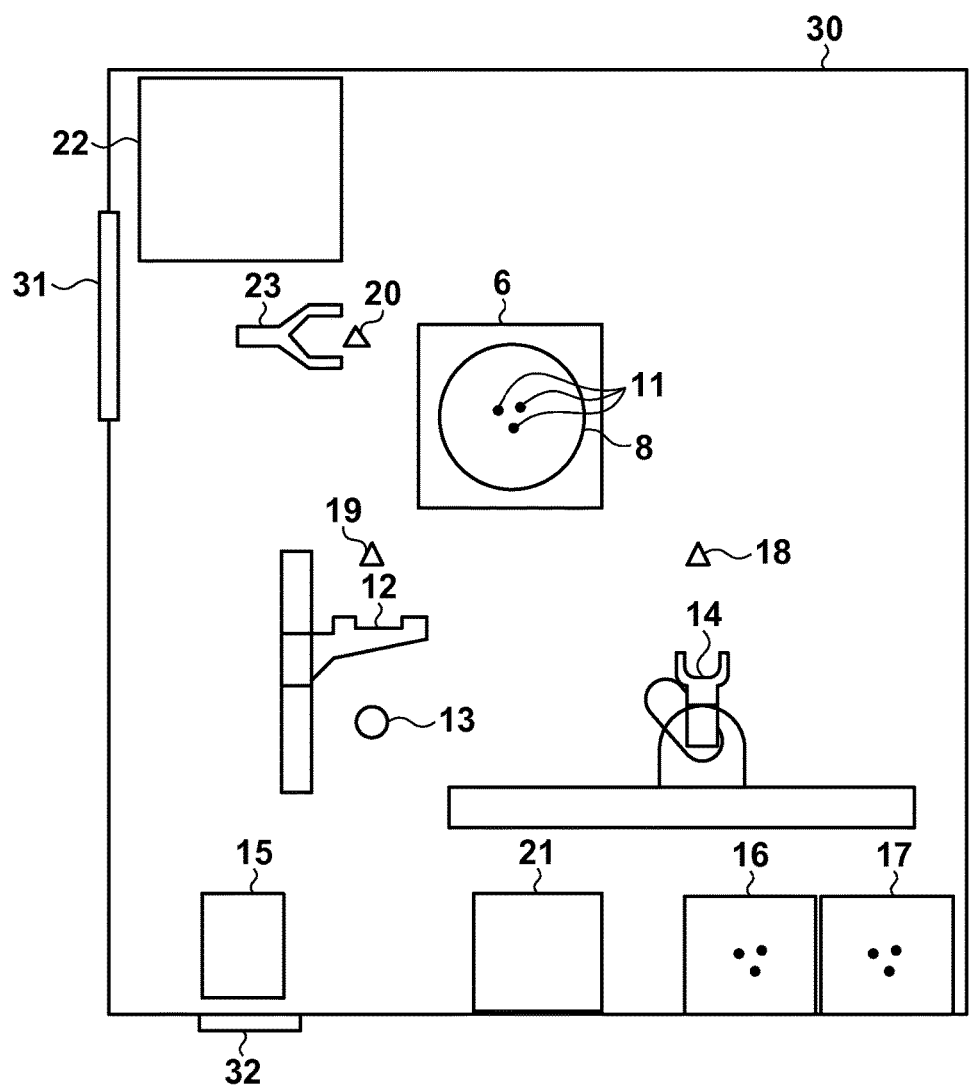
FIG. 8 is a schematic view showing the apparatus viewed from the upper side so as to explain portions concerning conveyance of a wafer and conveyance of members configured to recover a wafer chuck failure according to the second embodiment.

The second embodiment will be described. In the second embodiment as well, the arrangements shown in FIGS. 1 and 3 are applicable, as in the first embodiment. FIG. 8 is a schematic view showing an apparatus viewed from the upper side, placing focus on portions concerning conveyance of a wafer 9 and conveyance of members configured to recover a chuck failure. The second embodiment is different from the first embodiment shown in FIG. 2 in that a reject carrier 21 and a stocker 22 are provided. The reject carrier 21 stores the wafer 9 in which an abnormality has occurred during exposure processing separately from the wafer 9 that has normally undergone exposure processing. In addition, the reject carrier 21 is used to store a special wafer for the maintenance of the apparatus. The stocker 22 stores a pressing plate 24, a foreign substance removing member 25, and an interchangeable wafer chuck 26 which correspond to the members configured to recover a chuck failure. The pressing plate 24, the foreign substance removing member 25, and the interchangeable wafer chuck 26 are loaded into the stocker 22 by a robot hand 23 via a door 31 and stored in advance.

Figure 9:
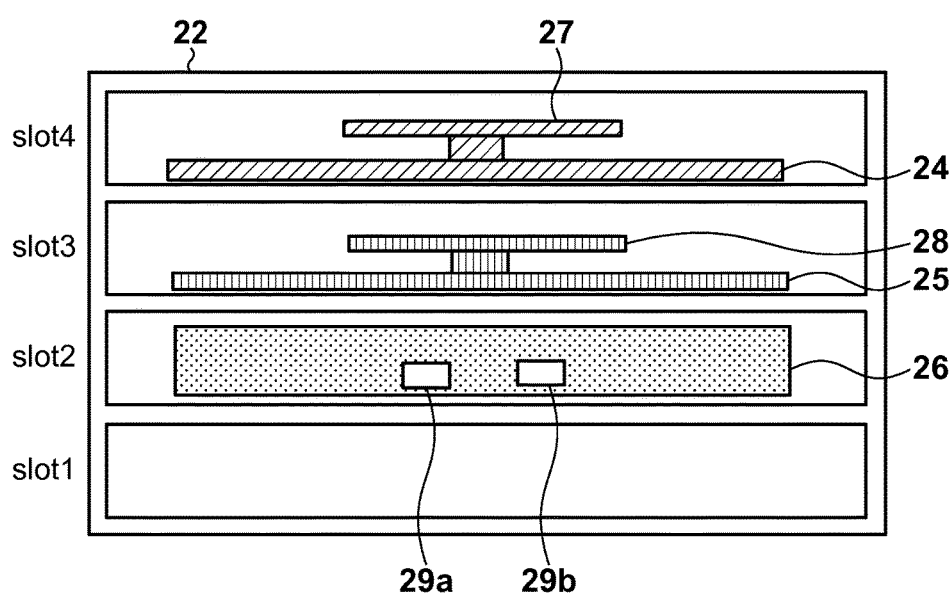
FIG. 9 is a schematic: view shoving the storage state of the members configured to recover a chuck failure.

FIG. 9 is a schematic view of the stocker (first storage unit) 22 viewed from the lateral direction. The stocker 22 includes a total of four storage units of slot 1, slot 2, slot 3, and slot 4 sequentially from the lower side. The number of slots is not limited to four. In FIG. 9, slot 1 is free, and nothing is arranged in it. The interchangeable wafer chuck (second chuck) 26 is stored in slot 2, the foreign substance removing member 25 is stored in slot 3, and the pressing plate 24 is stored in slot 4. A holding unit 27 is a portion of the pressing plate 24, at which the robot hand 23 holds and conveys the pressing plate 24. Similarly, a holding unit 28 is a portion of the foreign substance removing member 25, at which the robot hand 23 holds and conveys the foreign substance removing member 25. Holes 29a and 29b are insertion holes formed in the wafer chuck 26 for the robot hand 23, at which the robot hand 23 holds and conveys the interchangeable wafer chuck 26.

Figure 10A:
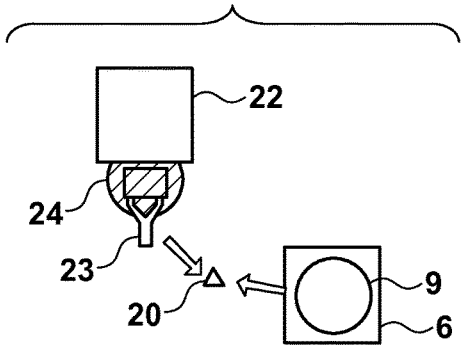
FIGS. 10A and 10B are schematic views for explaining conveyance of a pressing plate according to the second embodiment.
Figure 10B:
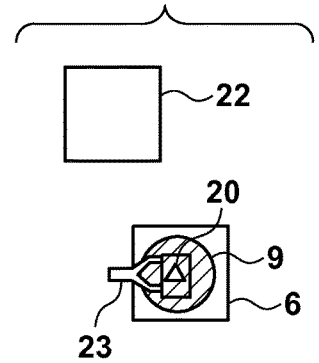

FIGS. 10A and 10B are schematic views time-serially showing motion viewed from the upper side in a state in which the robot hand 23 conveys the pressing plate 24 to a recovery processing position 20, and recovers a chuck failure by correcting the warp of the wafer 9. In FIG. 10A, the pressing plate 24 is loaded and arranged in the stocker 22 using the robot hand 23. The robot hand 23 acquires the pressing plate 24 from the stocker 22 and waits. A controller 15 determines the vacuum chuck state of the wafer 9 by a wafer chuck 8 in a state in which a wafer stage 6 holds the wafer 9 at a wafer transfer position 19. Before determining the presence/absence of a chuck failure, the robot hand 23 acquires the pressing plate 24 from the stocker 22 and waits.

The robot hand 23 may acquire the pressing plate 24 after determining the presence/absence of a chuck failure. In this case, however, the time of return from determination of the presence/absence of a chuck failure is delayed by the time needed to acquire the pressing plate 24.

In FIG. 10B, upon determining as the result of vacuum chuck state determination that a chuck failure has occurred, the controller 15 instructs the wafer stage 6 and the robot hand 23 holding the pressing plate 24 to move to the recovery processing position 20. At the recovery processing position 20, the warp of the wafer 9 is corrected using the pressing plate 24 described with reference to FIG. 4. When the chuck failure recovery processing has ended, the robot hand 23 may store the pressing plate 24 in the stocker 22 or wait at the waiting position near the stocker 22 while keeping holding the pressing plate 24. When continuously or frequently executing the correction processing of the warp of the wafer 9 by the pressing plate 24, the robot hand 23 can quickly execute chuck failure recovery processing by waiting while keeping holding the pressing plate 24, as a matter of course.

Figure 11A:
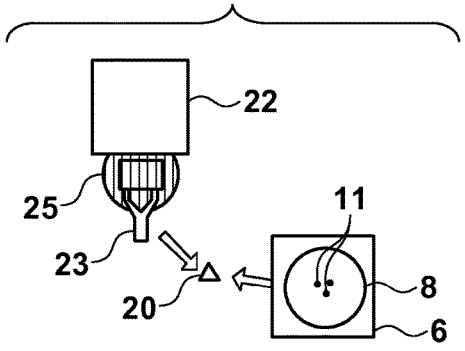
FIGS. 11A and 11B are schematic views for explaining conveyance of a foreign substance removing member according to the second embodiment.
Figure 11B:
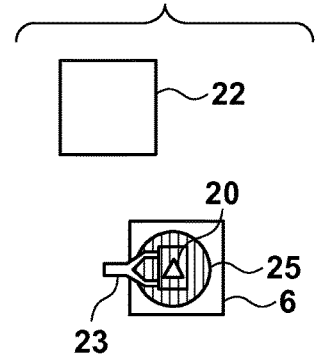

FIGS. 11A and 11B are schematic views time-serially showing motion viewed from the upper side in a state in which the robot hand 23 conveys the foreign substance removing member 25 to the recovery processing position 20, and removes foreign substances from the wafer chuck 8. In FIG. 11A, the foreign substance removing member 25 is loaded and stored in the stocker 22 using the robot hand 23. Upon judging that foreign substances on the wafer chuck 8 need to be removed, the controller 15 causes the robot hand 23 to acquire the foreign substance removing member 25 from the stocker 22. In FIG. 11B, the controller 15 instructs the wafer stage 6 and the robot hand 23 holding the foreign substance removing member 25 to move to the recovery processing position 20. At the recovery processing position 20, the wafer stage 6 moves in the X and Y directions while being in contact with the foreign substance removing member 25 at a standstill, thereby executing removal of the foreign substances sticking to the wafer chuck 8. When the foreign substance removal processing has ended, the robot hand 23 may convey the foreign substance removing member 25 to the stocker 22 and store it or wait at the waiting position shown in FIG. 10A while keeping holding the foreign substance removing member 25.

Figure 12:
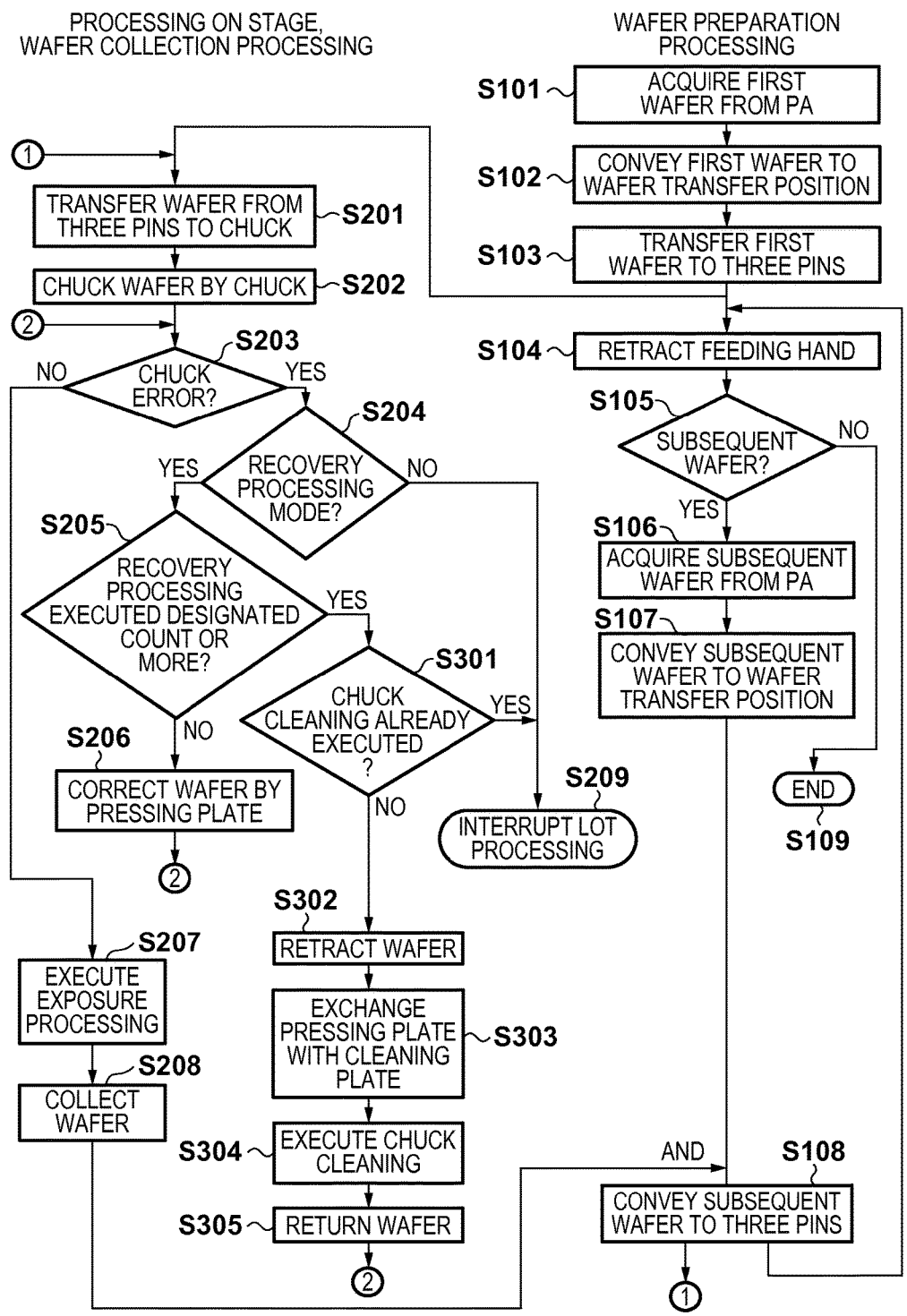
FIG. 12 is a flowchart showing the procedure of processing on a wafer stage, wafer collection processing, and wafer preparation processing according to the second embodiment.

FIG. 12 is a flowchart showing the procedure of processing on the wafer stage, wafer collection processing, and wafer preparation processing including chuck failure recovery processing including wafer warping correction by the pressing plate and foreign substance removal on the wafer chuck (chuck cleaning). The processing shown in FIG. 12 is the same as in FIG. 7 except steps S301 to S305, and a description thereof will be omitted. In step S301, the controller 15 determines whether chuck cleaning has already been executed during processing of the same lot. If chuck cleaning has already been executed, the process advances to step S209. If chuck cleaning has not been executed yet, the process advances to step S302.

In step S302, a wafer conveying robot hand 14 acquires the wafer 9 arranged on the wafer chuck 8, conveys the wafer 9 to the reject carrier 21 (second storage unit), and stores the wafer in it. In step S303, the robot hand 23 conveys the held pressing plate 24 to the stocker 22, stores the pressing plate 24 in it, and instead acquires the foreign substance removing member 25.

In step S304, foreign substance removal processing is executed. The foreign substance removal processing can be performed by making the wafer stage 6 move in the X and Y directions while keeping it in contact with the foreign substance removing member 25 at a standstill to remove the foreign substances sticking to the wafer chuck 8. Alternatively, the foreign substance removing member 25 may move in the X and Y directions while being in contact, and the wafer stage 6 may remain at a standstill. In step S305, the wafer conveying robot hand 14 acquires the wafer 9 stored in the reject carrier 21 in step S302, and arranges the wafer 9 on the wafer chuck 8 again.

As described above in the first embodiment, if a chuck failure cannot be recovered by a predetermined count of chuck failure recovery processing by the pressing plate 24, foreign substances on the wafer chuck 8 can be removed using the foreign substance removing member 25. Hence, a chuck failure can be recovered even when the cause of the chuck failure exists on the side of the wafer chuck 8. In the second embodiment, whether chuck cleaning has already been executed is judged during processing of the same lot. Even for a different lot, when continuously performing exposure, processing, it may be judged for continuous wafers in number to be processed whether chuck cleaning has already been executed.

Third Embodiment

Figure 13:
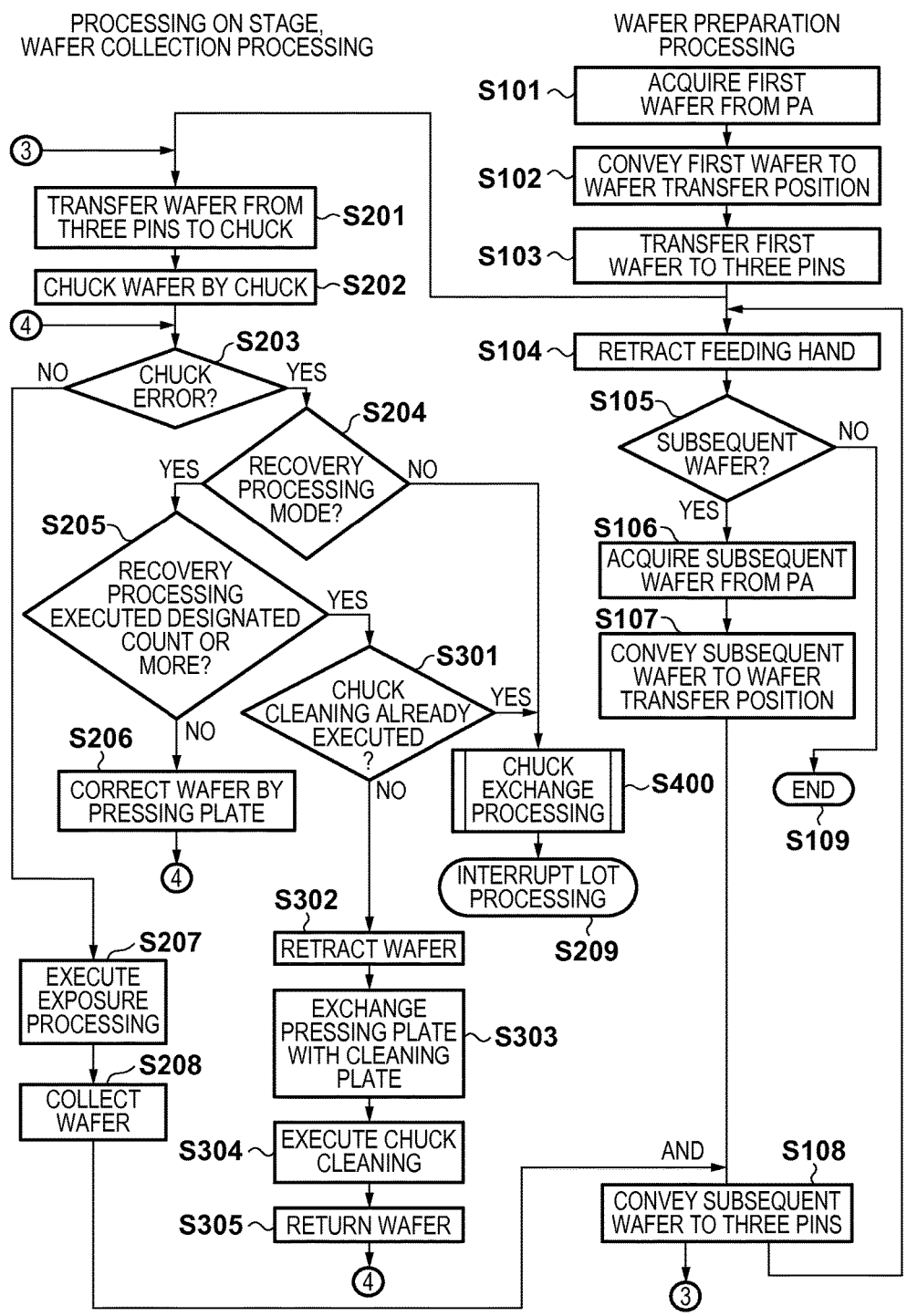
FIG. 13 is a flowchart showing the procedure of processing on a wafer stage, wafer collection processing, and wafer preparation processing according to the third embodiment.

The third embodiment will be described. The arrangements are the same as in the second embodiment except FIGS. 13 and 14, and a description thereof will be omitted. In addition, the flowchart of FIG. 13 is the same as FIG. 12 except a wafer chuck exchange sub-process of step S400, and a description of processes other than step S400 will be omitted. FIG. 13 is a flowchart when chuck failure recovery processing includes exchange processing of a wafer chuck 8. In step S204, a controller 15 confirms information representing whether a mode to execute chuck failure recovery processing by a pressing plate 24 is set. Upon determining in step S204 that the mode to execute chuck failure recovery processing by the pressing plate 24 is not set, or upon determining in step S301 that chuck cleaning has already been executed, the controller 15 executes the wafer chuck exchange sub-process in step S400.

Figure 14:
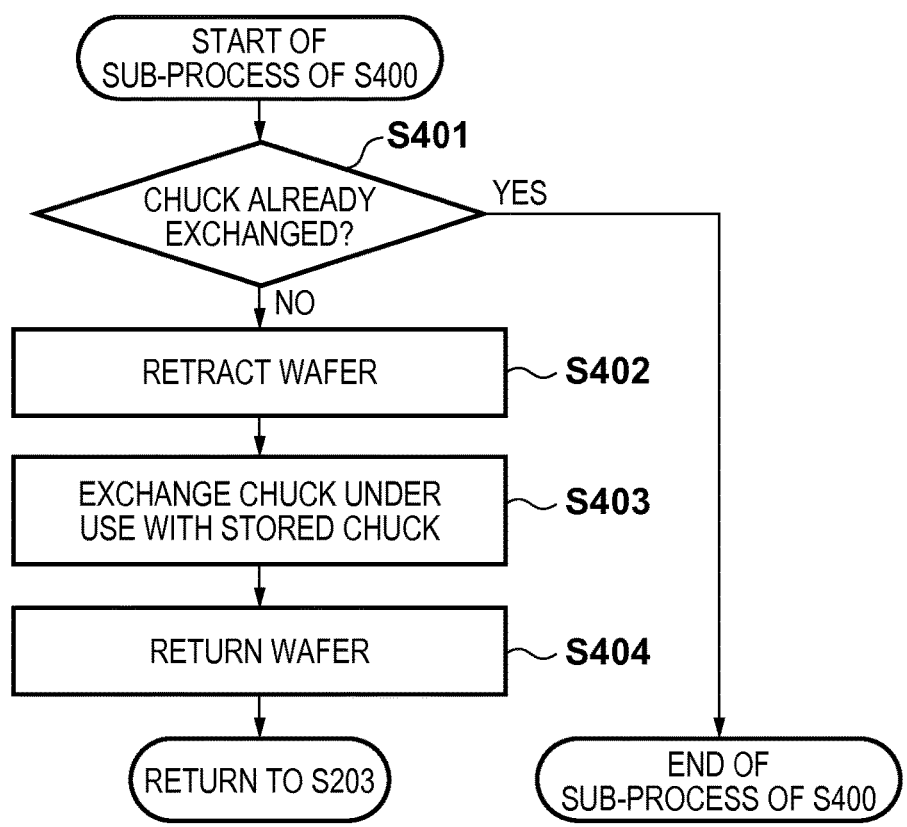
FIG. 14 is a flowchart for explaining a sub-process of exchanging a wafer chuck.

FIG. 14 is a flowchart for explaining a sub-process of exchanging the wafer chuck 8. In step S400, the sub-process starts. In step S401, the controller 15 judges whether wafer chuck exchange has already been executed during processing of the same lot. If wafer chuck exchange has already been executed, the controller 15 ends the sub-process of step S400. If wafer chuck exchange has not been executed yet, the process advances to step S402. In step S402, a wafer conveying robot hand 14 acquires a wafer 9 arranged on the wafer chuck 8, conveys the wafer to a reject carrier 21, and stores the wafer in it. In step S403, a robot hand 23 acquires the wafer chuck 8 from a wafer stage 6, conveys the wafer chuck to slot 1 that is a free slot in FIG. 9, and stores the wafer chuck in it. Next, the robot hand 23 acquires an unused interchangeable wafer chuck (second chuck) 26 from slot 2 in FIG. 9, conveys the wafer chuck to the wafer stage 6, and arranges the wafer chuck. In step S404, the wafer conveying robot hand 14 acquires the wafer 9 stored in the reject carrier 21 in step S402, and arranges the wafer 9 on the wafer chuck 8 again. The process returns to step S203 of FIG. 12.

Fourth Embodiment

Figure 15:
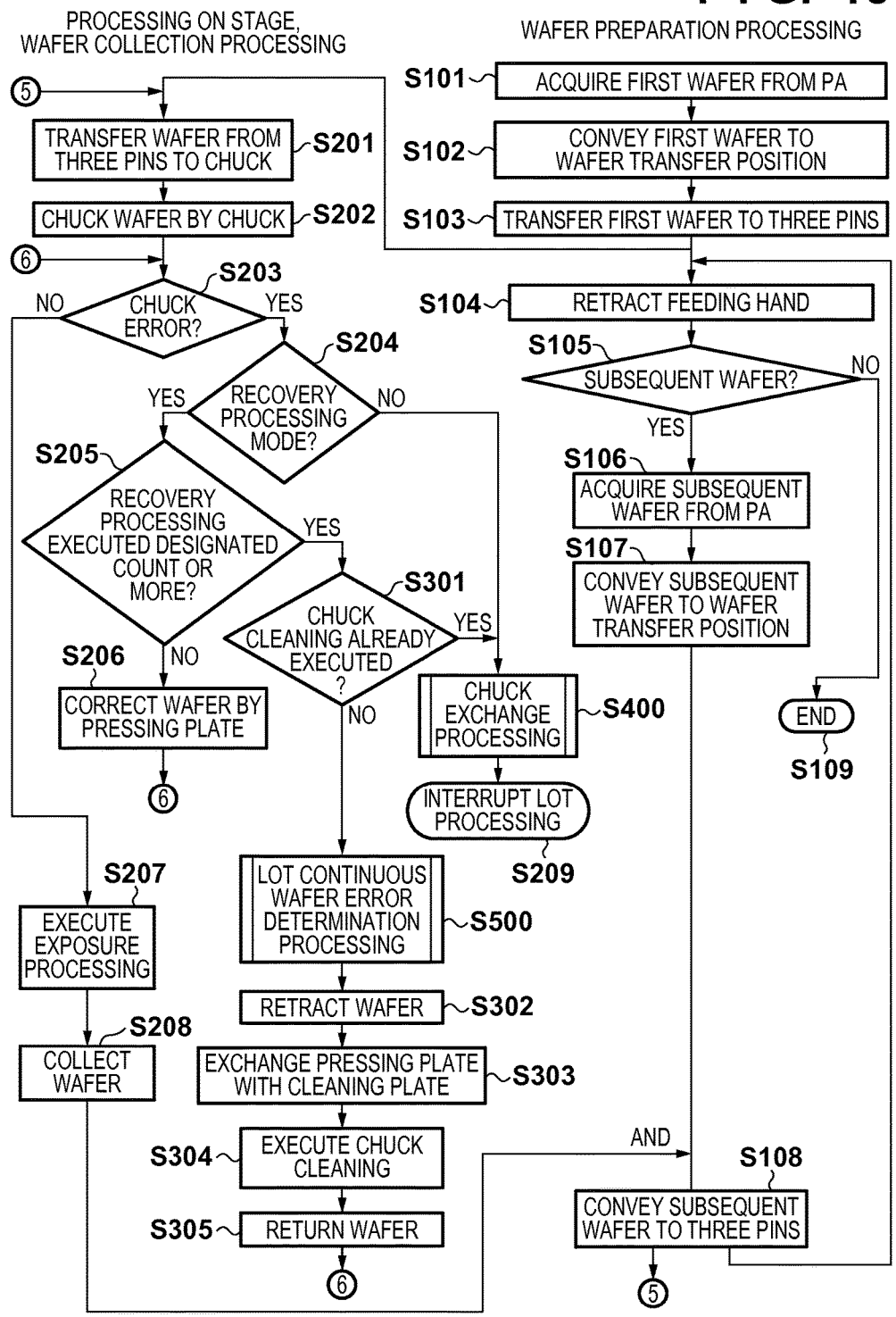
FIG. 15 is a flowchart showing the procedure of processing on a wafer stage, wafer collection processing, and wafer preparation processing according to the fourth embodiment.

The fourth embodiment will be described. The fourth embodiment is the same as the second embodiment except FIGS. 15 and 16, and a description thereof will be omitted. In addition, FIG. 15 is the same as FIG. 13 except the sub-process of step S500, and a description of processes other than step S500 will be omitted. FIG. 15 is a flowchart for explaining details of the sub-process of continuous wafer error processing when errors have continuously occurred in wafers in a lot. When chuck cleaning of removing foreign substances from a wafer chuck 8 has not been executed in the same lot, the sub-process of step S500 is executed.

Figure 16:
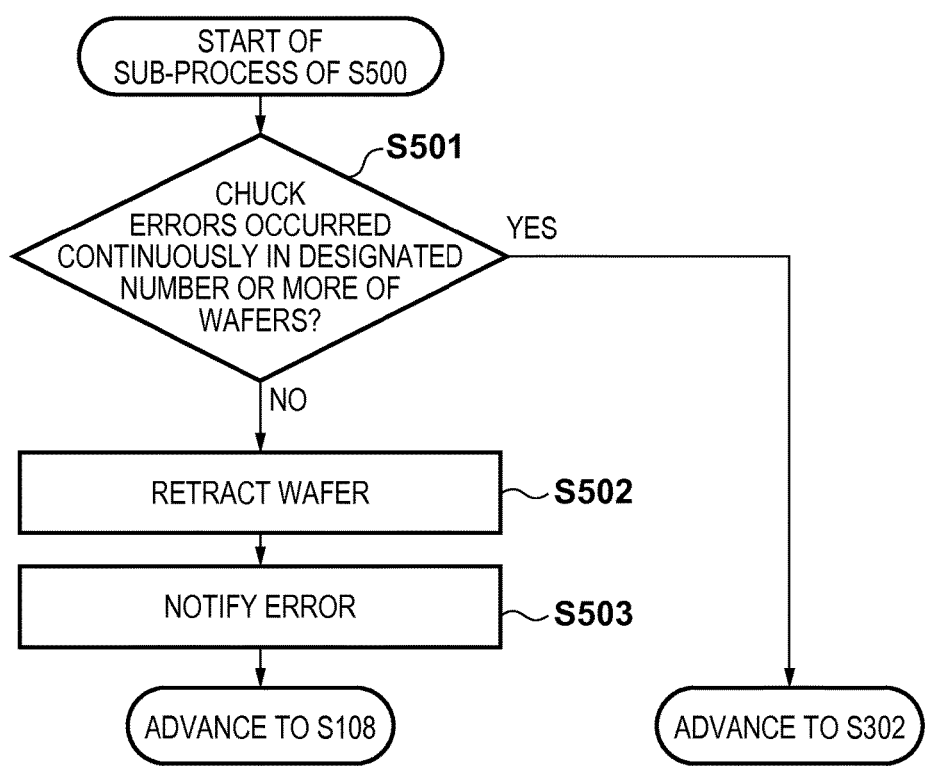
FIG. 16 is a flowchart for explaining a sub-process when chuck failures have continuously occurred.

FIG. 16 is a flowchart for explaining the sub-process of step S500. In step S501, a controller 15 determines whether the number of wafers 9 in which chuck failures have continuously occurred has reached a predetermined number set in advance. The predetermined number is a parameter that designates the number of wafers 9 continuously determined as chuck failures in the same lot to trigger execution of chuck cleaning. If chuck failures have continuously occurred in the predetermined number or more of wafers 9, the cause of the chuck failures can be estimated as foreign substances sticking to the wafer chuck 8. That is, when chuck failures have continuously occurred in the predetermined number or more of wafers 9, the chuck failures can be recovered by immediately cleaning the wafer chuck 8. The information of the predetermined number stored in advance is input from a user interface 32 or an external computer (not shown) connected via a network.

If the number of wafers 9 in which chuck failures have continuously occurred has not reached the predetermined number in step S501, the process advances to step S502. If the number of wafers 9 has reached the predetermined number, the process advances to step S302. In step S502, a wafer conveying robot hand 14 acquires the wafer 9 arranged on the wafer chuck 8, conveys the wafer to a reject carrier 21, and stores the wafer in it. In step S503, information representing that the target wafer 9 in which the chuck failure has occurred has been conveyed to the reject carrier 21 and stored is displayed on or sent to at least the user interface 32 or an external computer (not shown) connected via a network. After the process of step S503, the process advances to step S108.

In the fourth embodiment, the number of wafers 9 in which chuck failures have continuously occurred can be preset as the determination criterion. It is therefore possible to change the chuck failure recovery processing between a case in which the cause of chuck failures is foreign substances sticking to the lower surface of the wafer 9 and a case in which the cause is foreign substances sticking to the wafer chuck 8. When the recovery processing can be changed depending on the cause of chuck failures, the time necessary for the recovery processing can be shortened. For example, when a chuck failure has occurred due to foreign substances sticking to the lower surface of one specific wafer 9, only the wafer 9 is retracted to the reject carrier 21 as a defective wafer, and the subsequent wafers 9 are smoothly processed, thereby avoiding unnecessary chuck cleaning. On the other hand, when chuck failures have continuously occurred in a number of wafers 9, the possibility of foreign substance sticking to the wafer chuck 8 is high. In this case, the lot processing can be continued by executing chuck cleaning.

(Device Manufacturing Method)

A method of manufacturing a device (semiconductor device, liquid crystal display device, or the like) will be described next. The semiconductor device is manufactured by a pre-processing of forming an integrated circuit on a wafer and post-processing of completing the integrated circuit chip formed on the wafer by the pre-processing as a product. The pre-processing includes a process of exposing the wafer with an applied photoresist using the above-described exposure apparatus, and a process of developing the wafer. The post-processing includes an assembly process (dicing and bonding) and a packaging process (encapsulation). The liquid crystal display device is manufactured by a process of forming a transparent electrode. The process of forming a transparent electrode includes a process of applying a photoresist to a glass substrate on which a transparent conductive film is deposited, a process of exposing the glass substrate with the applied photoresist using the above-described exposure apparatus, and a process of developing the glass substrate. According to the device manufacturing method of this embodiment, it is possible to manufacture a device of higher quality than before.

The embodiments of the present invention have been described above. The present invention is not limited to those embodiments, and various changes and modifications can be made within the spirit and scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-004956, filed Jan. 15, 2013, which is hereby incorporated by reference herein in its entirety.

What is claimed is:

1. A processing apparatus for performing exposure processing of a substrate with light from a light source, the apparatus comprising:
    a stage;
    a chuck installed on the stage and configured to chuck the substrate; and
    a conveying unit configured to move, to a position above the chuck, one of a pressing member for pressing the substrate to reduce a warp of the substrate on the chuck and a cleaning member for cleaning the chuck,
    wherein, when a pressing operation for reducing the warp of the substrate is to be performed before performing the exposure processing of the substrate while the substrate is arranged on the chuck, the conveying unit moves the pressing member to the position above the chuck to press the substrate using the pressing member, and
    wherein, when a cleaning operation for cleaning the chuck is to be performed before performing the exposure processing of the substrate and after performing the pressing operation while the substrate is not arranged on the chuck, the conveying unit moves the cleaning member to the position above the chuck to clean the chuck using the cleaning member.

2. The apparatus according to claim 1,
    wherein the substrate undergoes pre-processing for a preparation of the substrate before the exposure processing, and
    wherein, when a failure of chucking of the substrate by the chuck has occurred, the conveying unit moves the pressing member to the position above the chuck to press the substrate using the pressing member, and a substrate to undergo the exposure processing next is conveyed to a position where the pre-processing is performed.

3. The apparatus according to claim 2, further comprising a pre-alignment unit configured to pre-align the substrate as the pre-processing.

4. The apparatus according to claim 1,
wherein, when the warp of the substrate chucked by the chuck falls within an allowable range and a failure of the chucking of the substrate by the chuck has occurred, the substrate is removed from the chuck without being pressed by the pressing member and the conveying unit moves the cleaning member to the position above the chuck to clean the chuck using the cleaning member.

5. The apparatus according to claim 4, further comprising a second storage unit configured to store the substrate removed from the chuck,
wherein, after performing the cleaning operation using the cleaning member, the substrate stored in the second storage unit is conveyed to the cleaned chuck.

6. The apparatus according to claim 1,
wherein, when a failure of the chucking of the substrate has occurred even after performing a predetermined count of the pressing of the substrate using the pressing member, the substrate is removed from the chuck and the conveying unit moves the cleaning member to the position above the chuck to clean the chuck using the cleaning member.

7. The apparatus according to claim 6, further comprising a second storage unit configured to store the substrate removed from the chuck,
wherein, after performing the cleaning operation using the cleaning member, the substrate stored in the second storage unit is conveyed to the cleaned chuck.

8. The apparatus according to claim 1,
wherein, when a failure of the chucking by the chuck has continuously occurred in a predetermined number of substrates even after performing the pressing of the substrate using the pressing member, the conveying unit moves the cleaning member to the position above the chuck to clean the chuck using the cleaning member.

9. The apparatus according to claim 1,
wherein the conveying unit moves one of the pressing member, the cleaning member, and an interchangeable second chuck to the position above the chuck or a position above the stage.

10. The apparatus according to claim 9,
wherein, when a failure of the chucking by the chuck has occurred even after the cleaning operation has been performed using the cleaning member, the substrate is removed from the chuck and the conveying unit removes the chuck from the stage, moves the second chuck to the position above the stage, and installs the second chuck on the stage.

11. The apparatus according to claim 10, further comprising a second storage unit configured to store the substrate removed from the chuck,
wherein, after the conveying unit has installed the second chuck on the stage, the substrate stored in the second storage unit is conveyed to the second chuck.

12. The apparatus according to claim 9, further comprising a first storage unit configured to store the pressing member, the cleaning member, and the second chuck,
wherein the conveying unit moves one of the pressing member, the cleaning member, and the second chuck from the first storage unit to the position above the chuck or the position above the stage.

13. The apparatus according to claim 1, wherein the pressing of the substrate using the pressing member is performed by raising the stage.

14. The apparatus according to claim 1, wherein the pressing of the substrate using the pressing member is performed by lowering the pressing member.

15. A processing apparatus for performing exposure processing of a substrate with light from a light source, the apparatus comprising:
a stage;
a chuck installed on the stage and configured to chuck the substrate; and
a conveying unit configured to move, to a position above the stage, one of an interchangeable second chuck and a pressing member for pressing the substrate to reduce a warp of the substrate on the chuck,
wherein, when a pressing operation for reducing the warp of the substrate is to be performed before performing the exposure processing of the substrate while the substrate is arranged on the chuck, the conveying unit moves the pressing member to the position above the stage to press the substrate using the pressing member, and
wherein, when an interchanging operation for interchanging the chuck and the second chuck on the stage is to be performed before performing the exposure processing of the substrate and after performing the pressing operation while the substrate is not arranged on the chuck, the conveying unit moves the second chuck to the position above the stage to install the second chuck on the stage.

16. A processing method for performing exposure processing of a substrate with light from a light source and selectively performing a pressing operation to reduce a warp of the substrate or a cleaning operation to clean a chuck on a stage, the method comprising:
moving, by a conveying unit, to a position above the chuck, one of a pressing member for pressing the substrate to reduce the warp of the substrate and a cleaning member for cleaning the chuck,
wherein when the pressing operation for reducing the warp of the substrate is to be performed before performing the exposure processing of the substrate while the substrate is arranged on the chuck, the conveying unit moves the pressing member to the position above the chuck to press the substrate using the pressing member, and
wherein when a cleaning operation for cleaning the chuck is to be performed before performing the exposure processing of the substrate and after performing the pressing operation while the substrate is not arranged on the chuck, the conveying unit moves the cleaning member to the position above the chuck to clean the chuck using the cleaning member.

17. A processing method for performing exposure processing of a substrate with light from a light source and selectively performing a pressing operation to reduce a warp of the substrate or an interchanging operation to execute an interchange of a chuck and an interchangeable second chuck, the method comprising:
moving, by a conveying unit, to a position above a stage where the chuck is installed, one of the interchangeable second chuck and a pressing member for pressing the substrate to reduce the warp of the substrate on the chuck,
wherein, when the pressing operation for reducing the warp of the substrate is to be performed before performing the exposure processing of the substrate while the substrate is arranged on the chuck, the conveying unit moves the pressing member to the position above the stage to press the substrate using the pressing member, and wherein, when the interchanging operation is to be performed before performing the exposure processing of the substrate and after performing the pressing operation while the substrate is not arranged on the chuck, the conveying unit moves the second chuck to the position above the stage to install the second chuck on the stage.

18. A processing apparatus for performing exposure processing of a substrate with light from a light source, the apparatus comprising:

a stage;

a chuck installed on the stage and configured to chuck the substrate;

a first conveying unit configured to convey the substrate; and a second conveying unit configured to move, to a position above the chuck, one of a pressing member for pressing the substrate to reduce a warp of the substrate on the chuck and a cleaning member for cleaning the chuck, wherein, when a pressing operation for reducing the warp of the substrate is to be performed before performing the exposure processing of the substrate while the substrate is arranged on the chuck by the first conveying unit, the second conveying unit moves the pressing member to the position above the chuck to press the substrate using the pressing member, and wherein, when a cleaning operation for cleaning the chuck is to be performed before performing the exposure processing of the substrate and after performing the pressing operation while the substrate is not arranged on the chuck, the second conveying unit moves the cleaning member to the position above the chuck to clean the chuck using the cleaning member.

19. The apparatus according to claim 18, wherein the substrate undergoes pre-processing for a preparation of the substrate before the exposure processing, and wherein, when a failure of chucking of the substrate by the chuck has occurred, the second conveying unit moves the pressing member to the position above the chuck to press the substrate using the pressing member, and a substrate to undergo the exposure processing next is conveyed to a position where the pre-processing is performed.

20. The apparatus according to claim 18, wherein, when the warp of the substrate chucked by the chuck falls within an allowable range and a failure of the chucking of the substrate by the chuck has occurred, the first conveying unit removes the substrate from the chuck without being pressed by the pressing member and the second conveying unit moves the cleaning member to the position above the chuck to clean the chuck using the cleaning member.

21. The apparatus according to claim 18, wherein, when a failure of the chucking of the substrate has occurred even after performing a predetermined count of the pressing of the substrate using the pressing member, the first conveying unit removes the substrate from the chuck and the second conveying unit moves the cleaning member to the position above the chuck to clean the chuck using the cleaning member.

22. The apparatus according to claim 18, wherein, when a failure of the chucking by the chuck has continuously occurred in a predetermined number of substrates even after performing the pressing of the substrate using the pressing member, the second conveying unit moves the cleaning member to the position above the chuck to clean the chuck using the cleaning member.

23. The apparatus according to claim 18, wherein the second conveying unit moves one of the pressing member, the cleaning member, and an interchangeable second chuck to the position above the chuck or a position above the stage.

24. A processing method for performing exposure processing of a substrate with light from a light source and selectively performing a pressing operation to reduce a warp of the substrate or a cleaning operation to clean a chuck on a stage, the method comprising:

conveying, by a first conveying unit, the substrate; and moving, by a second conveying unit, to a position above the chuck, one of a pressing member for pressing the substrate to reduce the warp of the substrate and a cleaning member for cleaning the chuck, wherein, when the pressing operation for reducing the warp of the substrate is to be performed before performing the exposure processing of the substrate while the substrate is arranged on the chuck by the first conveying unit, the second conveying unit moves the pressing member to the position above the chuck to press the substrate using the pressing member, and wherein, when a cleaning operation for cleaning the chuck is to be performed before performing the exposure processing of the substrate and after performing the pressing operation while the substrate is not arranged on the chuck, the second conveying unit moves the cleaning member to the position above the chuck to clean the chuck using the cleaning member.

25. A processing apparatus for performing exposure processing of a substrate with light from a light source and for selectively performing a cleaning operation to clean a chuck on a stage or an interchanging operation to execute an interchange of the chuck on the stage and an interchangeable second chuck, the apparatus comprising:

the chuck configured to chuck the substrate;

a conveying unit configured to move, to a position above the stage, one of the second chuck or a cleaning member for cleaning the chuck, wherein, when the cleaning operation is to be performed before performing the exposure processing of the substrate while the substrate is not arranged on the chuck, the conveying unit moves the cleaning member to the position above the chuck to clean the chuck using the cleaning member, and wherein, when the interchanging operation is to be performed before performing the exposure processing of the substrate and after performing the pressing operation while the substrate is not arranged on the chuck, the conveying unit moves the second chuck to the position above the stage to install the second chuck on the stage.

26. A processing method for performing exposure processing of a substrate with light from a light source and for selectively performing a cleaning operation to clean a chuck on a stage or an interchanging operation to execute an interchange of the chuck on the stage and an interchangeable second chuck, the method comprising:

moving, by a conveying unit, to a position above the chuck, one of a second chuck and a cleaning member for cleaning the chuck, wherein, when the cleaning operation is to be performed before performing the exposure processing of the substrate while the substrate is not arranged on the chuck, the conveying unit moves the cleaning member to the position above the chuck to clean the chuck using the cleaning member, and wherein, when the interchanging operation is to be performed before performing the exposure processing of the substrate and after performing the cleaning operation while the substrate is not arranged on the chuck, the conveying unit moves the second chuck to the position above the stage to install the second chuck on the stage.

* * * * *